United States Patent
Chae et al.

(10) Patent No.: US 7,800,427 B2
(45) Date of Patent: Sep. 21, 2010

(54) SWITCHED CAPACITOR CIRCUIT WITH INVERTING AMPLIFIER AND OFFSET UNIT

(75) Inventors: Youngcheol Chae, Seoul (KR); Gunhee Han, Goyang-si (KR); Seog-Heon Ham, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 200 days.

(21) Appl. No.: 11/986,345

(22) Filed: Nov. 21, 2007

(65) Prior Publication Data

US 2008/0116966 A1    May 22, 2008

(30) Foreign Application Priority Data

Nov. 21, 2006    (KR)    ............... 10-2006-0115386

(51) Int. Cl.
*G06G 7/184*    (2006.01)
*H03M 3/02*    (2006.01)

(52) U.S. Cl. .................. 327/337; 327/554; 341/150; 341/172

(58) Field of Classification Search ........ 327/337, 327/554; 341/150, 172
See application file for complete search history.

(56) References Cited

U.S. PATENT DOCUMENTS

| | | | | |
|---|---|---|---|---|
| 4,055,777 A | * | 10/1977 | Black | 327/85 |
| 5,113,150 A | * | 5/1992 | Waizman | 330/264 |
| 5,475,337 A | | 12/1995 | Tatsumi | 327/551 |
| 5,479,130 A | * | 12/1995 | McCartney | 327/341 |
| 5,739,720 A | * | 4/1998 | Lee | 330/9 |
| 6,037,836 A | * | 3/2000 | Yoshizawa | 330/9 |
| 6,169,440 B1 | * | 1/2001 | Liu | 327/337 |
| 6,278,750 B1 | * | 8/2001 | Yu | 375/345 |
| 6,608,575 B2 | * | 8/2003 | Bazarjani | 341/143 |
| 6,611,164 B2 | * | 8/2003 | Uno | 327/361 |
| 6,825,739 B2 | * | 11/2004 | Fujimoto | 333/173 |
| 6,956,515 B2 | * | 10/2005 | Keehr et al. | 341/150 |
| 7,126,415 B2 | * | 10/2006 | Maloberti et al. | 330/9 |
| 7,236,113 B1 | * | 6/2007 | Wang | 341/143 |
| 7,498,875 B2 | * | 3/2009 | Forbes et al. | 330/9 |

OTHER PUBLICATIONS

Korean Patent Application No. 1020040115948 to Park, having Publication date of Jul. 5, 2006 (w/ English Abstract page).

Japanese Patent Application No. 08-217851 to Makoto et al., having Publication date of Feb. 20, 1998 (w/ English Abstract page).

(Continued)

*Primary Examiner*—Lincoln Donovan
*Assistant Examiner*—Terry L Englund
(74) *Attorney, Agent, or Firm*—Monica H. Choi

(57) ABSTRACT

A switched capacitor circuit includes an amplifier, a charging unit, an offset unit, and an integrating unit. The charging unit is coupled between an input node and a first node, and is for accumulating charge corresponding to an input signal during a sampling mode. The offset unit is coupled between the first node and an input of the amplifier, and is for maintaining the first node to be a virtual ground during an integrating mode. The integrating unit is coupled between the first node and an output of the amplifier, and is for receiving charge from the charging unit during the integrating mode.

16 Claims, 6 Drawing Sheets

OTHER PUBLICATIONS

Japanese Patent Application No. 10-190004 to Takeshi, having Publication date of Jan. 21, 2000 (w/ English Abstract page).
Korean Patent Application No. 1020010030842 to Han et al., having Publication date of Dec. 11, 2002 (w/ English Abstract page).
Japanese Patent Application No. 04-007158 to Tetsuya, having Publication date of Sep. 21, 1993 (w/ English Abstract page).
Japanese Patent Application No. 04-197978 to Satoshi, having Publication date of Feb. 18, 1994 (w/ English Abstract page).

* cited by examiner

US 7,800,427 B2

SWITCHED CAPACITOR CIRCUIT WITH INVERTING AMPLIFIER AND OFFSET UNIT

BACKGROUND OF THE INVENTION

This application claims priority under 35 USC §119 to Korean Patent Application No. 2006-115386 filed on Nov. 21, 2006 in the Korean Intellectual Property Office, the disclosure of which is incorporated herein in its entirety by reference.

1. Field of the Invention

The present invention relates generally to switched capacitor circuits, and more particularly, to a switched capacitor circuit implemented with a single ended inverter and an offset unit for rendering a node as virtual ground.

2. Background of the Invention

A switched capacitor circuit is generally a type of filter that is comprised of capacitors and switches without any inductor or resistor. A switched capacitor circuit is amenable to be fabricated with the complementary metal-oxide-semiconductor (CMOS) process. A switched capacitor circuit is easily integrated with the CMOS process in a single chip without resistors and is amenable for decreased power consumption.

In addition, a switched capacitor circuit uses a capacitor instead of a resistor that may result in higher error, for improving accuracy when a single integrated circuit chip is fabricated during a CMOS process. Switched capacitor circuits are developing along with CMOS analog circuit technology, and are widely employed for processing analog signals such as for communication-specific LSI for example.

FIG. 1 shows a general switched capacitor circuit 10 according to the prior art. Referring to FIG. 1, the switched capacitor circuit 10 includes an operational-transconductance amplifier (OTA), a plurality of switches S1, S2, S3, S4, and S5, and a plurality of capacitors C1 and C2.

The switched capacitor circuit 10 operates with a first set of switches S1, S3, and S5 being closed when a first switch control signal ⏀1 is activated to the logic high state (and being open otherwise). A second set of switches S2 and S4 are closed when a second switch control signal ⏀2 is activated to the logic high state (and are open otherwise).

When the first set of switches S1, S3, and S5 are closed with the second set of switches S2 and S4 being open, the capacitor C1 accumulates charge corresponding to an input signal Vi while the capacitor C2 is reset. Subsequently when the second set of switches S2 and S4 are closed with the first set of switches S1, S3, and S5 being open, charge is transferred to the capacitor C2 from the capacitor C1 for satisfying the following equation:

$$\frac{V_o}{V_i} = \frac{C_1}{C_2}$$

Vo is an output signal generated at an output node of the OTA. $C_1$ is the capacitance of the capacitor C1, and $C_2$ is the capacitance of the capacitor C2.

The switched capacitor circuit 10 is widely used in analog circuits such as an integrator, an adder, or an amplifier for example with relatively small errors. The switched capacitor circuit 10 is also used in a discrete-time analog filter, an analog-to-digital converter, and a digital-to-analog converter. The switched capacitor circuit 10 uses the OTA in a feedback loop. However, the OTA consumes much power and occupies a large circuit area in the switched capacitor circuit 10.

SUMMARY OF THE INVENTION

Accordingly, the present invention uses an inverter for forming a switched capacitor circuit for reduced power consumption and reduced integrated circuit area.

A switched capacitor circuit according to an aspect of the present invention includes an amplifier, a charging unit, an offset unit, and an integrating unit. The charging unit is coupled between an input node and a first node, and is for accumulating charge corresponding to an input signal during a sampling mode. The offset unit is coupled between the first node and an input of the amplifier, and is for rendering the first node to be a virtual ground during an integrating mode. The integrating unit is coupled between the first node and an output of the amplifier, and is for receiving charge from the charging unit during the integrating mode.

In an example embodiment of the present invention, the amplifier is an inverter, and the charging unit includes a first switch and a sampling capacitor. The first switch has a first switch node that is the input node with the input signal applied thereon and has a second switch node. The sampling capacitor has a first sampling capacitor node coupled to the second switch node and has a second sampling capacitor node that is the first node. The offset unit includes an offset capacitor having a first offset capacitor node coupled to the second sampling capacitor node and having a second offset capacitor node coupled to the input of the inverter.

In an embodiment of the present invention, the first switch, the sampling capacitor, and the offset capacitor are directly connected in series between the first switch node and the input of the inverter.

In an example embodiment of the present invention, the inverter is an inverting amplifier.

In a further embodiment of the present invention, the charging unit further includes a second switch coupled between the second switch node and a ground node, and includes a third switch coupled between the second sampling capacitor node and the ground node.

In another embodiment of the present invention, the integrating unit includes a feedback capacitor and a fourth switch. The feedback capacitor has a first feedback capacitor node coupled to an output of the inverter and has a second feedback capacitor node. The fourth switch is coupled between the second sampling capacitor node and the second feedback capacitor node.

In a further embodiment of the present invention, the first and third switches are controlled according to a first signal, and the second and fourth switches are controlled according to a second signal. The first and second signals are non-overlapping two-phase clock signals. In that case, the first and third switches are closed while the second and fourth switches are open during the sampling mode when the sampling capacitor accumulates charge corresponding to the input signal. In addition, the first and third switches are open while the second and fourth switches are closed during the integrating mode when the feedback capacitor receives charge from the sampling capacitor.

In another embodiment of the present invention, the offset unit further includes a fifth switch coupled between the input and the output of the inverter. The fifth switch is controlled according to the first signal such that the fifth switch is closed during the sampling mode and open during the integrating mode. For example, such a switched capacitor circuit is connected within a sigma delta modulator with the output of the inverter being connected to an input of a comparator.

Alternatively, such a switched capacitor circuit is connected within an inverted amplifier further including first, second, and third additional switches. In that case, the first additional switch is coupled between the first feedback capacitor node and the output of the inverter and is controlled by the second signal. The second additional switch is coupled between the second feedback capacitor node and the ground node and is controlled by the first signal. The third additional switch is coupled between the first feedback capacitor node and the ground node and is controlled by the first signal.

Furthermore, such a switched capacitor circuit is connected within a non-inverted amplifier further including first, second, and third additional switches. In that case, the first additional switch is coupled between the first feedback capacitor node and the output of the inverter and is controlled by the first signal. The second additional switch is coupled between the second feedback capacitor node and the ground node and is controlled by the second signal. The third additional switch is coupled between the first feedback capacitor node and the ground node and is controlled by the second signal.

In another embodiment of the present invention, the switched capacitor circuit also includes a sixth switch coupled between the output of the inverter and an output node having an output signal generated thereon. The sixth switch is controlled according to the second signal such that the sixth switch is open during the sampling mode and closed during the integrating mode.

In an alternative embodiment of the present invention, the switched capacitor circuit includes a fifth switch coupled between the second feedback capacitor node and the input of the inverter. In that case, the fifth switch is controlled according to the first signal such that the fifth switch is closed during the sampling mode and open during the integrating mode.

In an example embodiment of the present invention, such a switched capacitor circuit is connected within one of first and second paths for positive and negative input signals of a pseudo-differential integrator with the ground node having a common voltage generated thereon. In that case, the switched capacitor circuit is connected in symmetry with another switched capacitor circuit.

In this manner, the switched capacitor circuit uses a simple single-ended inverter for forming a feedback loop for reduced power consumption and reduced integrated circuit area.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and/or function.

DETAILED DESCRIPTION OF THE INVENTION

Figure 1:
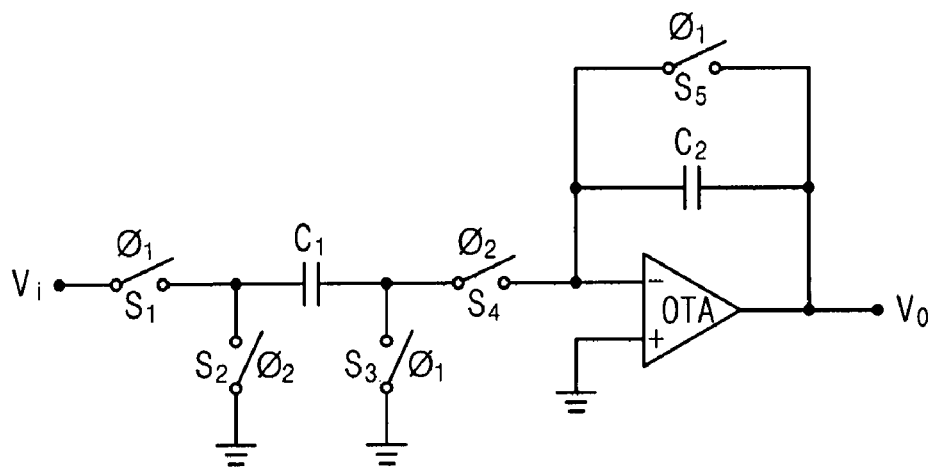
FIG. 1 shows a general switched capacitor circuit according to the prior art.
Figure 2:
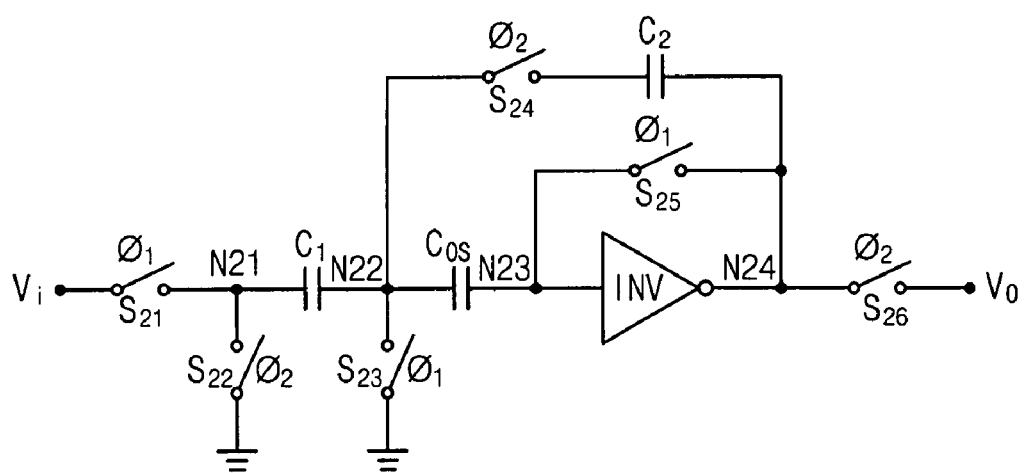
FIG. 2 shows a switched capacitor circuit with an inverter for forming an integrator, according to an embodiment of the present invention.

FIG. 2 shows a switched capacitor circuit 20 for implementing an integrator according to an embodiment of the present invention. Referring to FIG. 2, the switched capacitor circuit 20 includes an inverter INV, and first, second, third, fourth, fifth, and sixth switches S21, S22, S23, S24, S25, and S26, respectively. The switched capacitor circuit 20 also includes a sampling capacitor C1, an offset capacitor Cos, and a feedback capacitor C2.

The inverter INV is single-ended with a single input and a single output according to an embodiment of the present invention. Such an inverter has a simpler circuitry than the OTA of the prior art such that the switched capacitor circuit 20 consumes less power and occupies less integrated circuit area. The inverter INV is a typical inverter having a gain of about −1 in one embodiment of the present invention. Alternatively, the inverter INV is an inverting amplifier providing a negative gain with a magnitude of the gain being greater than 1.

The inverter INV is used for forming a feedback loop. The offset capacitor Cos compensates for an offset voltage of the inverter INV by storing charge corresponding to the offset voltage of the inverter INV.

The first switch S21 has a first switch node that is an input node with an input signal Vi applied thereon and has a second switch node N21. The sampling capacitor C1 has a first sampling capacitor node connected to the second switch node N21 and has a second sampling capacitor node N22. The second switch S22 is connected between the second switch node N21 and a ground node, and the third switch S23 is connected between the second sampling capacitor node N22 and the ground node.

The offset capacitor Cos has a first offset capacitor node connected to the second sampling capacitor node N22 and has a second offset capacitor node N23 connected to an input of the inverter INV. Thus, the first switch S21, the sampling capacitor C1, and the offset capacitor Cos are directly connected to each other in series between the first switch node having the input signal Vi applied thereon and the input of the inverter INV.

The feedback capacitor C2 has a first feedback capacitor node N24 connected to an output of the inverter INV and has a second feedback capacitor node. The fourth switch S24 is connected between the second sampling capacitor node N22 and the second feedback capacitor node. The fifth switch S25 is connected between the input and the output of the inverter INV. The sixth switch S26 is connected between the output of the inverter INV and an output node having an output signal Vo generated thereon.

The first, third, and fifth switches S21, S23, and S25, respectively, are controlled with a first switch control signal φ1. The second, fourth, and sixth switches S22, S24, and S26, respectively, are controlled with a second switch control signal φ2. The first and second switch control signals φ1 and φ2 are non-overlapping two-phase clock signals in one embodiment of the present invention.

Accordingly, the switched capacitor circuit 20 operates as follows. During a sampling mode, the first, third, and fifth switches S21, S23, and S25, respectively, are closed while the second, fourth, and sixth switches S22, S24, and S26, respectively, are open. In that case, the switched capacitor circuit 20 is configured as illustrated in FIG. 3 when charge corresponding to the input signal Vi is accumulated across the sampling capacitor C1 with the node N22 being grounded.

Figure 3:
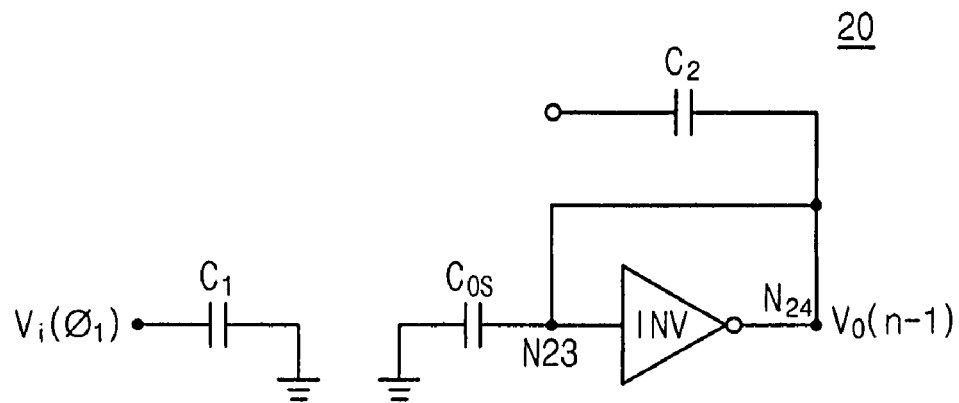
FIG. 3 shows a configuration of the switched capacitor circuit of FIG. 2 during a sampling mode, according to an embodiment of the present invention.

Further referring to FIG. 3, the node N21 has the input signal Vi applied thereon, and the node N22 is connected to the ground node such that the capacitor C1 accumulates charge corresponding to the input signal Vi. At the same time, the node N22 accumulates charge opposite to the charge stored in the input node N21. The charge Q1($nT$) accumulated across the sampling capacitor C1 is expressed as the following Equation 1:

$$Q_1(nT) = C_1 \times V_i(nT) \qquad \text{[Equation 1]}$$

$C_1$ is the capacitance of the sampling capacitor C1, and $V_i(nT)$ is the input signal generated during the sampling mode.

Further during the sampling mode of FIG. 3, the fifth switch S25 that is closed shorts together the input and the output of the inverter INV. In that case, the offset capacitor Cos accumulates charge corresponding to the offset voltage Vos of the inverter INV. Such charge Qos(nT) is expressed as the following Equation 2:

$$Q_{os}(nT) = C_{os} \times V_{os}(nT) \qquad \text{[Equation 2]}$$

$C_{os}$ is the capacitance of the offset capacitor Cos.

Also during the sampling mode of FIG. 3, the feedback capacitor C2 stores charge from the previous cycle of the switch control signals. Thus, such charge Q2($nT$) at the feedback capacitor C2 is expressed as the following Equation 3:

$$Q_2(nT) = C_2 \times V_o\left(nT - \frac{1}{2}T\right) = C_2 \times V_0(nT - T) \qquad \text{[Equation 3]}$$

$C_2$ is the capacitance of the feedback capacitor C2.

Subsequently during an integrating mode, the first, third, and fifth switches S21, S23, and S25, respectively, are open while the second, fourth, and sixth switches S22, S24, and S26, respectively, are closed. In that case, the switched capacitor circuit 20 is configured as illustrated in FIG. 4.

Figure 4:
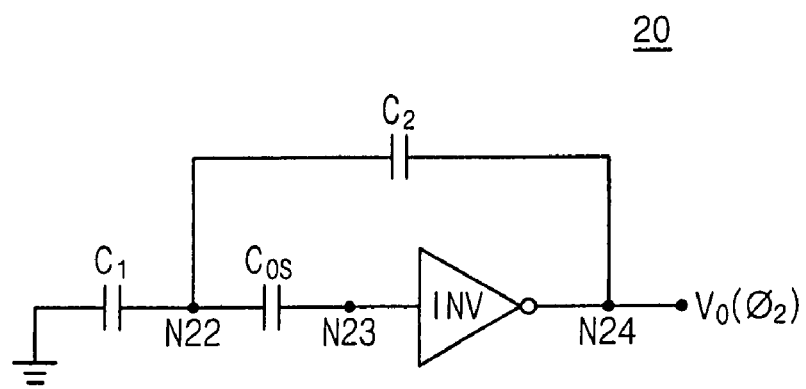
FIG. 4 shows a configuration of the switched capacitor circuit of FIG. 2 during an integrating mode, according to an embodiment of the present invention.

Referring to FIG. 4 for the integrating mode, the sampling capacitor C1 couples the node N21 to the ground node in response to the second switch control signal φ2. Then, charge stored in the input node N21 is discharged to ground. In addition, the reverse charge accumulated in the node N22 that is now rendered a virtual ground during the integrating mode is transferred to one end of the feedback capacitor C2.

In the integrating mode, the node N22 is connected to the feedback capacitor C2, and a feedback loop is formed by the inverter INV. At this point, the node N22 acts as the virtual ground of the integrator 20, and the charge accumulated at the virtual ground N22 during the sampling mode is transferred to one end of the feedback capacitor C2. Thus, the feedback capacitor C2 is used for performing an integral operation by accumulating charge from the sampling capacitor C1.

Thus, during the integrating mode of FIG. 4, there is no charge accumulated in the sampling capacitor C1 as expressed by the following Equation 4:

$$Q_1\left(nT + \frac{1}{2}T\right) = 0 \qquad \text{[Equation 4]}$$

Also in response to the second switch control signal φ2, the charge stored in the sampling capacitor C1 is transferred to the feedback capacitor C2 because the inverter INV has no current passing to the input of the inverter INV. Thus, the charge in the offset capacitor Cos does not change such that the offset capacitor Cos simply holds charge corresponding to the offset voltage Vos as expressed by the following Equation 5:

$$Q_{os}\left(nT + \frac{1}{2}T\right) = C_{os} \times V_{os}\left(nT + \frac{1}{2}T\right) \qquad \text{[Equation 5]}$$
$$= C_{os} \times V_{os}(nT)$$

Further during the integrating mode, the feedback capacitor C2 accumulates the charge transferred from the virtual ground node N22. Such charge Q2 at the feedback capacitor C2 is expressed as the following Equation 6:

$$Q_2\left(nT + \frac{1}{2}T\right) = C_2 \times V_s\left(nT + \frac{1}{2}T\right) \qquad \text{[Equation 6]}$$

The total amount of charge in the switched capacitor circuit 20 during the sampling mode is same as the total amount of charge during the subsequent integrating mode. Thus, Equations 1, 2, 3, 4, 5, and 6 above have the following relationship of Equation 7 below:

$$C_1 \times V_i(nT) + C_{os} \times V_{os}(nT) + C_2 \times V_o(nT - T) = \qquad \text{[Equation 7]}$$
$$0 + C_{os} \times V_{os}(nT) + C_2 \times V_0\left(nT + \frac{1}{2}T\right)$$

Therefore, the output signal Vo according to the switch control signals φ1 and φ2 may be expressed as the following Equation 8:

$$V_o\left(nT + \frac{1}{2}T\right) = V_o\left(nT - \frac{1}{2}T\right) + \frac{C_1}{C_2} \times V_i(nT) \qquad \text{[Equation 8]}$$
$$V_o(nT) = V_o(nT - T) + \frac{C_1}{C_2} \times V_i\left(nT - \frac{1}{2}T\right)$$

When the switch control signals φ1 and φ2 are changed to discrete signals, the output signal Vo is also expressed as the following Equation 9:

$$V_0(n) = V_0(n-1) + \frac{C_1}{C_2} \times V_i\left(n - \frac{1}{2}\right)$$ [Equation 9]

Equation 9 is transformed in the Z-domain to result in the following Equation 10:

$$V_0(z) = z^{-1}V_0(z) + z^{-\frac{1}{2}} \times \frac{C_1}{C_2} \times V_i(z)$$ [Equation 10]

Thus, a transfer function H(z) of the switched capacitor circuit 20 is given by the following Equation 11:

$$H(z) = \frac{V_o(z)}{V_i(z)} = \frac{C_1}{C_2} \times \frac{z^{-\frac{1}{2}}}{(1-z^{-1})}$$ [Equation 11]

Accordingly in the switched capacitor circuit 20, the output signal Vo is not adversely affected by the offset voltage Vos of the inverter INV. In addition, by using the inverter INV as an amplifier instead of an OTA, the switched capacitor circuit 20 consumes less power and occupies less integrated circuit area than a switched capacitor circuit of the prior art.

Figure 5:
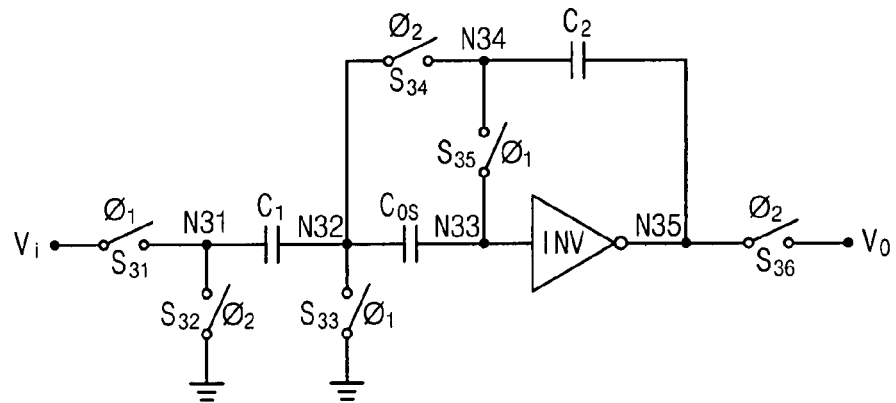
FIG. 5 shows a switched capacitor circuit with an inverter for forming a modified integrator, according to another embodiment of the present invention.

The switched capacitor circuit 20 may also be designed to operate in response to an offset control switch signal for storing and maintaining charge in the offset capacitor Cos corresponding to the offset voltage Vos. FIG. 5 shows an embodiment of a switched capacitor circuit 30 according to another embodiment of the present invention.

The switched capacitor circuit 30 of FIG. 5 includes the sampling capacitor C1, the offset capacitor Cos, and the feedback capacitor C2, configured similarly to the switched capacitor circuit 20 of FIG. 2. In addition, the switched capacitor circuit 30 of FIG. 5 includes first, second, third, fourth, and sixth switches S31, S32, S33, S34, and S36, respectively, configured similarly to the switched capacitor circuit 20 of FIG. 2. However in FIG. 5, a fifth switch S35 is connected between the second feedback capacitor node and the input of the inverter INV. The present invention may be practiced with other modifications or alterations in the switched capacitor circuit.

Figure 6:
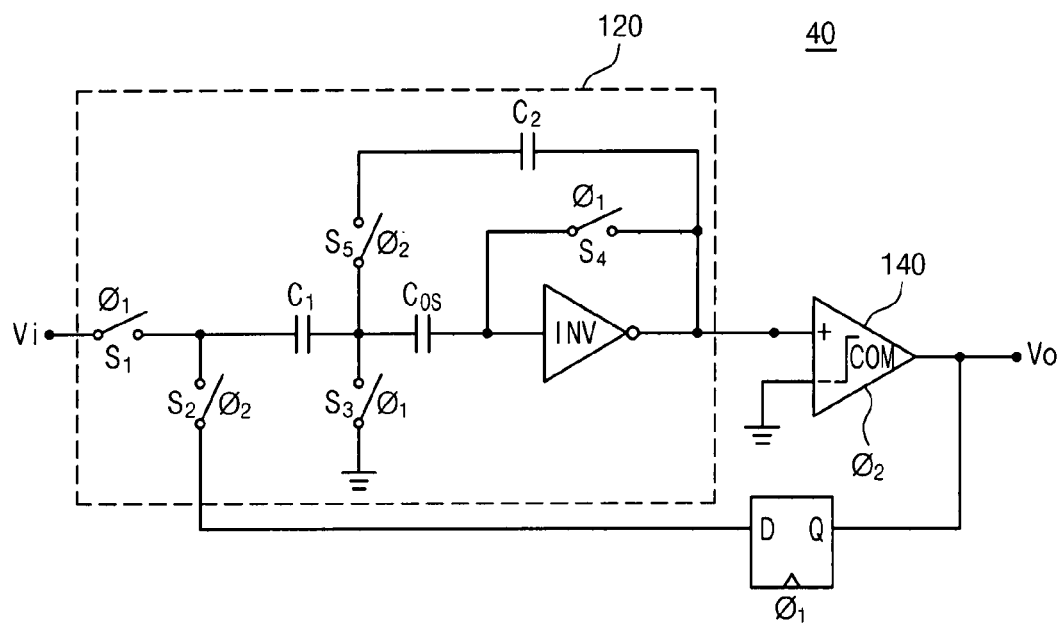
FIG. 6 shows a sigma-delta modulator having components of the switched capacitor circuit of FIG. 2, according to an embodiment of the present invention.

FIG. 6 shows a sigma-delta modulator 40 including components of the switched capacitor circuit of FIG. 2. For example, the sigma delta modulator 40 of FIG. 6 includes components C1, C2, Cos, S1, S2, S3, S4, and S5 that are similar to the components C1, C2, Cos, S21, S22, S23, S25, and S24, respectively, of FIG. 2. However, the switch S2 is connected between the first sampling capacitor node and a D-input of a delay flip flop.

In addition, the sigma-delta modulator 40 of FIG. 6 also includes a comparator 140 having a positive input connected to an output of the inverter INV and having a negative input connected to the ground node. An output node of the comparator 140 is connected to a Q-output of the delay flip flop that is clocked with the first switch control signal φ1.

Figure 7:
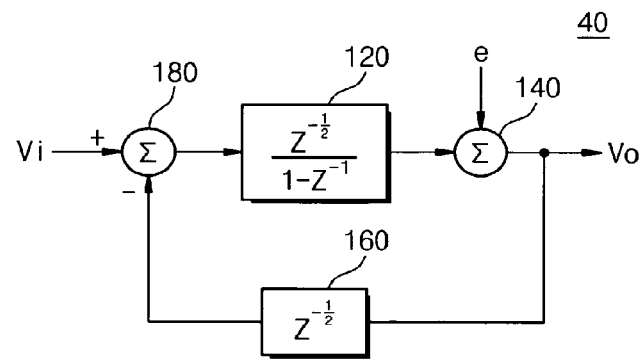
FIG. 7 is a block diagram illustrating the sigma-delta modulator of FIG. 6 in the Z-domain, according to an embodiment of the present invention.

FIG. 7 illustrates a block diagram of the sigma-delta modulator 40 of FIG. 6 in the Z-domain. Referring to FIG. 7, the sigma-delta modulator 40 includes a switched capacitor circuit 120 and the comparator 140 for comparing an output of the switched capacitor circuit 120 with a ground voltage Vss of the ground node. The sigma-delta modulator 40 further includes a feedback loop with delay 160 for feeding back an output value Y of the comparator 140 with a feedback gain.

The sigma-delta modulator 40 also includes a subtractor 180 for generating a difference between an input signal X and the output value Y of the comparator 140 multiplied by the feedback gain.

Assuming that a quantization noise e is a difference voltage between the input X and the output Y of the comparator 140, the sigma-delta modulator 40 is characterized by the following Equation 12:

$$Y = Z^{-\frac{1}{2}}X + (1 - Z^{-1})e$$ [Equation 12]

Thus, the sigma-delta modulator 40 functions as a low pass filter to the input signal X, or as a high pass filter to the quantization noise e.

Figure 8:
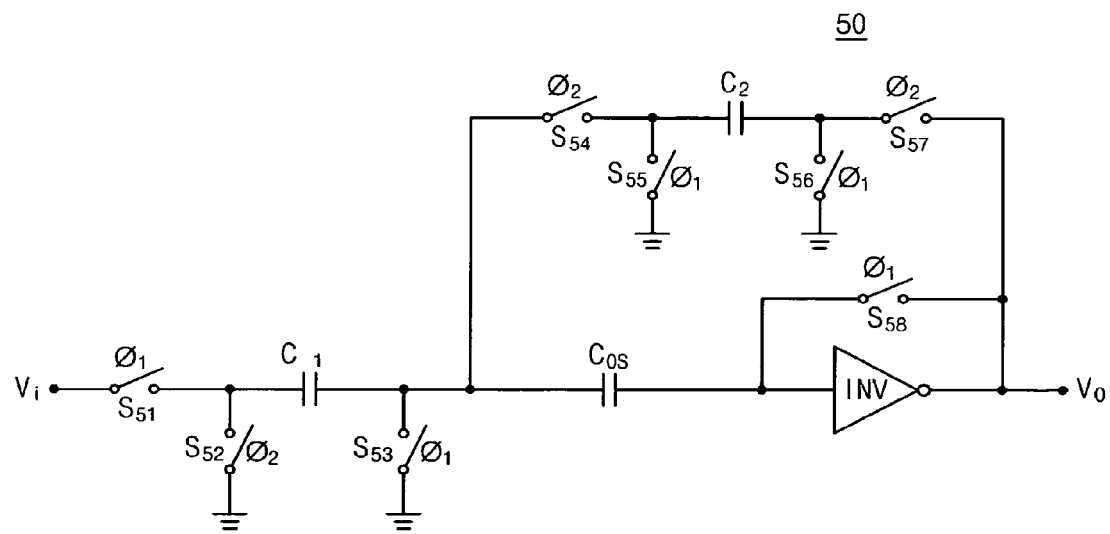
FIG. 8 shows an inverted amplifier having components of the switched capacitor circuit of FIG. 2, according to an embodiment of the present invention.

FIG. 8 shows a circuit diagram of an inverted amplifier 50 implemented with components of the switched capacitor circuit of FIG. 2, according to an embodiment of the present invention. The inverted amplifier 50 includes components C1, C2, Cos, and the first, second, third, fourth, and fifth switches S51, S52, S53, S54, and S58 configured similarly as switches S21, S22, S23, S24, and S25, respectively, in FIG. 2.

Further referring to FIGS. 2 and 8, the inverted amplifier 50 also includes a first additional switch S57 coupled between the first feedback capacitor node and the output of the inverter that is controlled by the second switch control signal φ2. In addition, a second additional switch S55 is coupled between the second feedback capacitor node and the ground node and is controlled by the first switch control signal φ1. Also, a third additional switch S56 is coupled between the first feedback capacitor node and the ground node and is controlled by the first switch control signal φ1. The inverted amplifier 50 provides an inverted gain between the output signal Vo and the input signal Vi.

Figure 9:
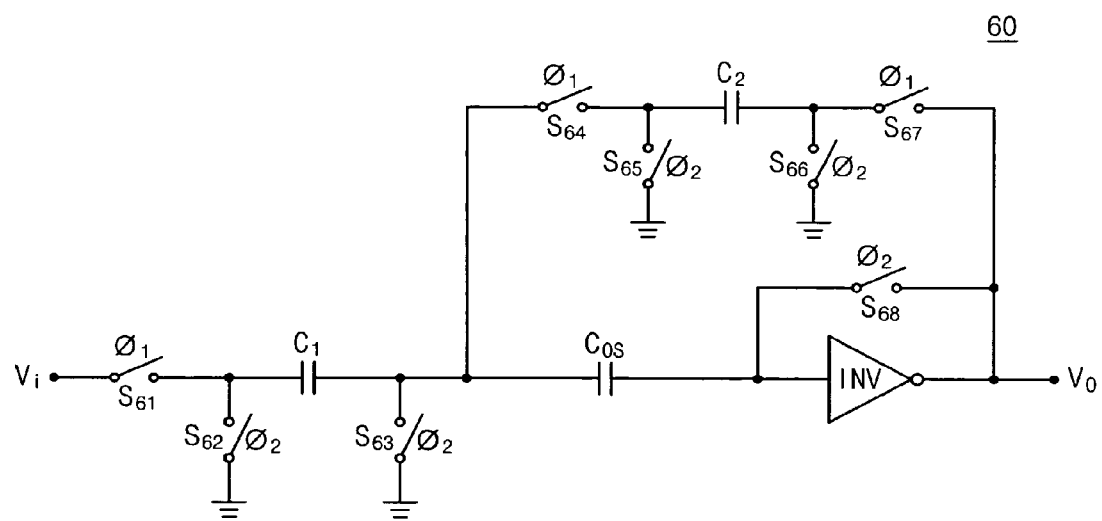
FIG. 9 shows a non-inverted amplifier having components of the switched capacitor circuit of FIG. 2, according to an embodiment of the present invention.

FIG. 9 shows a circuit diagram of a non-inverted amplifier 60 implemented with components of the switched capacitor circuit of FIG. 2, according to another embodiment of the present invention. The inverted amplifier 50 includes components C1, C2, Cos, and the first, second, third, fourth, and fifth switches S61, S62, S63, S64, and S68 configured similarly as switches S21, S22, S23, S24, and S25, respectively, in FIG. 2.

Further referring to FIGS. 2 and 9, the inverted amplifier 60 also includes a first additional switch S67 coupled between the first feedback capacitor node and the output of the inverter that is controlled by the first switch control signal φ1. In addition, a second additional switch S65 is coupled between the second feedback capacitor node and the ground node and is controlled by the second switch control signal φ2. Also, a third additional switch S66 is coupled between the first feedback capacitor node and the ground node and is controlled by the second switch control signal φ2. The non-inverted amplifier 60 provides a non-inverted gain between the output signal Vo and the input signal Vi.

Figure 10:
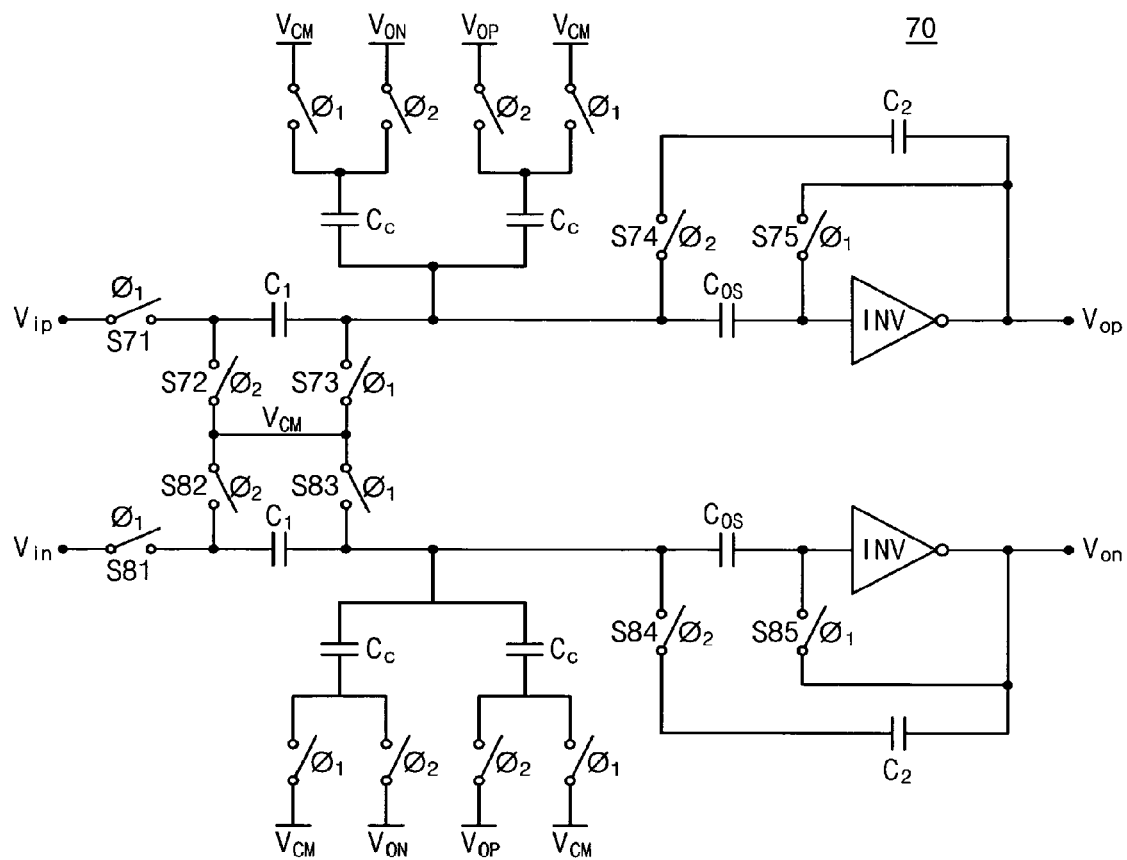
FIG. 10 shows a pseudo-differential integrator having components of the switched capacitor circuit of FIG. 2, according to an embodiment of the present invention.

FIG. 10 shows a circuit diagram of a pseudo-differential integrator 70 implemented with components of the switched capacitor circuit of FIG. 5, according to another embodiment of the present invention. The pseudo-differential integrator 70 includes first and second paths for differential input signals Vip and Vin, with each path including respective components C1, C2, Cos, and the first, second, third, fourth, and fifth switches S71, S72, S73, S74, and S75 of the first path and S81, S82, S83, S84, and S85 of the second path configured similarly as switches S21, S22, S23, S24, and S25, respectively, in FIG. 2. The respective switched capacitor circuits of the first and second paths for differential input signals Vip and Vin are configured in symmetry with respect to each-other.

In addition, the ground node has a common voltage VCM generated thereon in FIG. 10. Furthermore, each of the first and second paths for differential input signals Vip and Vin includes coupling capacitors Cc each switching in the common voltage VCM according to the first switch control signal φ1 or switching in one of negative or positive bias signals VON or VOP according to the second switch control signal φ2.

The switched capacitor circuit 20 or 30 of the present invention may also be used in other types of applications such as a correlated double-sampling (CDS) amplifier for example.

While the present invention has been shown and described with reference to exemplary embodiments thereof, it will be understood by those of ordinary skill in the art that various changes in form and detail may be made herein without departing from the spirit and scope of the present invention, as defined by the following claims.

For example, the present invention may be practiced with another type of amplifier for the example inverter INV. In addition, the sampling capacitor C1 and the switches S21, S22, and S23 generally form a charging unit for accumulating charge corresponding to the input voltage Vi during the sampling mode. Furthermore, the feedback capacitor C2 and the switch S24 generally form an integrating unit for receiving the charge from the charging unit during the integrating mode.

Also, the offset capacitor Cos and the switch S25 form an offset unit that renders the node N22 a virtual ground during the integrating mode by storing charge corresponding to the offset voltage of the inverter INV. Such a charging unit, integrating unit, and offset unit may be implemented in other ways.

The present invention is limited only as defined in the following claims and equivalents thereof.

What is claimed is:

1. A switched capacitor circuit comprising:
   an amplifier that is a single-ended inverter with a single input and a single output;
   a charging unit, coupled between an input node and a first node, for accumulating charge corresponding to an input signal during a sampling mode;
   an offset unit, coupled between the first node and the single input of the inverter, for maintaining the first node to be a virtual ground during an integrating mode; and
   an integrating unit, coupled between the first node and the single output of the inverter, for receiving charge from the charging unit during the integrating mode;
   wherein the charging unit includes:
      a first switch having a first switch node that is said input node with the input signal applied thereon and having a second switch node; and
      a sampling capacitor having a first sampling capacitor node coupled to the second switch node and having a second sampling capacitor node that is said first node;
   and wherein the offset unit includes:
      an offset capacitor having a first offset capacitor node coupled to the second sampling capacitor node and having a second offset capacitor node coupled to the single input of the inverter;
   and wherein the charging unit further includes:
      a second switch coupled between the second switch node and a ground node; and
      a third switch coupled between the second sampling capacitor node and the ground node;
   and wherein the integrating unit includes:
      a feedback capacitor having a first feedback capacitor node coupled to the single output of the inverter and having a second feedback capacitor node; and
      a fourth switch coupled between the second sampling capacitor node and the second feedback capacitor node;
   and wherein the first and third switches are controlled according to a first signal, and wherein the second and fourth switches are controlled according to a second signal.

2. The switched capacitor circuit of claim 1, wherein the first and second signals are non-overlapping two-phase clock signals.

3. The switched capacitor circuit of claim 1, wherein the first and third switches are closed while the second and fourth switches are open during the sampling mode when the sampling capacitor accumulates charge corresponding to the input signal, and wherein the first and third switches are open while the second and fourth switches are closed during the integrating mode when the feedback capacitor receives charge from the sampling capacitor.

4. The switched capacitor circuit of claim 3, wherein the offset unit further includes:
   a fifth switch coupled between the input and the output of the inverter, wherein the fifth switch is controlled according to the first signal such that the fifth switch is closed during the sampling mode and open during the integrating mode.

5. The switched capacitor circuit of claim 4, wherein the switched capacitor circuit is connected within a sigma delta modulator with the output of the inverter being connected to an input of a comparator.

6. The switched capacitor circuit of claim 4, wherein the switched capacitor circuit generates an output signal with a negative gain of the input signal, and wherein the switched capacitor circuit further includes:
   a first additional switch coupled between the first feedback capacitor node and the output of the inverter and being controlled by the second signal;
   a second additional switch coupled between the second feedback capacitor node and the ground node and being controlled by the first signal; and
   a third additional switch coupled between the first feedback capacitor node and the ground node and being controlled by the first signal.

7. The switched capacitor circuit of claim 4, wherein the switched capacitor circuit generates an output signal with a positive gain of the input signal, and wherein the switched capacitor circuit further includes:
   a first additional switch coupled between the first feedback capacitor node and the output of the inverter and being controlled by the first signal;
   a second additional switch coupled between the second feedback capacitor node and the ground node and being controlled by the second signal; and
   a third additional switch coupled between the first feedback capacitor node and the ground node and being controlled by the second signal.

8. The switched capacitor circuit of claim 4, further comprising:
   a sixth switch coupled between the output of the inverter and an output node having an output signal generated thereon, wherein the sixth switch is controlled according to the second signal such that the sixth switch is open during the sampling mode and closed during the integrating mode.

9. The switched capacitor circuit of claim 3, further comprising:
another switch coupled between the output of the inverter and an output node having an output signal generated thereon, wherein the other switch is controlled according to the second signal such that the other switch is open during the sampling mode and closed during the integrating mode.

10. The switched capacitor circuit of claim 3, further comprising:
a fifth switch coupled between the second feedback capacitor node and the input of the inverter, wherein the fifth switch is controlled according to the first signal such that the fifth switch is closed during the sampling mode and open during the integrating mode.

11. The switched capacitor circuit of claim 10, further comprising:
a sixth switch coupled between the output of the inverter and an output node having an output signal generated thereon, wherein the sixth switch is controlled according to the second signal such that the sixth switch is open during the sampling mode and closed during the integrating mode.

12. The switched capacitor circuit of claim 10, wherein the switched capacitor circuit is connected within one of the first and second paths for positive and negative input signals of a pseudo-differential integrator with the ground node having a common voltage generated thereon.

13. The switched capacitor circuit of claim 12, wherein the switched capacitor circuit is connected in symmetry with another switched capacitor circuit.

14. A switched capacitor circuit comprising:
a first capacitor coupled between a first node and a second node for accumulating charge during a sampling mode;
a second capacitor coupled between the second node and a fourth node for receiving charge from the first capacitor during an integrating mode;
a third capacitor coupled between the second node and a third node for maintaining the first node to be a virtual ground during the integrating mode;
a first switch coupled between an input node and the first node and operating in response to a first signal during the sampling mode;
a second switch coupled between the first node and a ground and operating in response to a second signal during the integrating mode;
a third switch coupled between the second node and the ground and operating in response to the first signal;
a fourth switch coupled between the second node and the second capacitor and operating in response to the second signal;
a fifth switch coupled between the third node and the fourth node and operating in response to the first signal; and
an inverting amplifier coupled between the third node and the fourth node for forming a feedback loop.

15. The switched capacitor circuit of claim 14, further comprising:
a sixth switch coupled between the fourth node and an output node and operating in response to the second signal.

16. The switched capacitor circuit of claim 14, wherein the first signal and the second signal are non-overlapping two-phase clock signals.

* * * * *